United States Patent [19]

Plumb

[11] Patent Number: 4,830,986

[45] Date of Patent: May 16, 1989

[54] LASER MANUFACTURE

[75] Inventor: Richard G. S. Plumb, Harlow, Great Britain

[73] Assignee: ITT Corporation, New York, N.Y.

[21] Appl. No.: 861,015

[22] Filed: May 8, 1986

[30] Foreign Application Priority Data

May 15, 1985 [GB] United Kingdom ............... 8512321

[51] Int. Cl.⁴ .................. H01L 21/20; H01L 21/203; H01L 21/205
[52] U.S. Cl. ..................... 437/129; 372/45; 372/46; 148/DIG. 100; 148/DIG. 95; 357/16; 357/17; 437/126; 437/133
[58] Field of Search ............... 29/569 L; 372/45, 46; 148/DIG. 100, DIG. 95, DIG. 65; 357/16, 17; 437/129, 126, 133, 165, 167, 229, 225, 238, 235, 241, 189, 192

[56] References Cited

U.S. PATENT DOCUMENTS

| | | | |
|---|---|---|---|
| 4,213,805 | 7/1980 | Tsukada | 29/569 L |
| 4,400,813 | 8/1983 | Kaminow | 372/45 |
| 4,575,919 | 3/1986 | Logan et al. | 437/129 |
| 4,622,673 | 11/1986 | Tsang | 372/45 |
| 4,644,551 | 2/1987 | Kawano et al. | 372/45 |
| 4,662,988 | 5/1987 | Renner | 437/129 |
| 4,728,628 | 3/1988 | Fiddyment et al. | 437/129 |

OTHER PUBLICATIONS

Serikawa et al, "Lift-Off Patterning of Sputtered $SiO_2$ Films", J. Electrochem. Soc., vol. 128, No. 4, Apr. 1981, pp. 918–919.

Ghandhi, *VLSI Fabrication Principles*, New York: John Wiley and Sons, 1983.

Primary Examiner—Brian E. Hearn
Assistant Examiner—M. Wilczewski
Attorney, Agent, or Firm—Walter J. Baum; Peter A. Abruzzese; Robert A. Walsh

[57] ABSTRACT

A ridge waveguide laser structure is manufactured by a method including providing a photoresist stripe (8) on an exposed area of a p cap layer (4) of a multilayer laser wafer; etching channels (9) through the cap layer (4) and a p passive layer (3) using the stripe (8) and an oxide layer window (FIG. 4) as a mask; evaporating a passivating and insulating oxide (11, 11a) over the wafer, there being breaks (C) in the oxide where the stripe (8) is undercut during channel etching; and removing the stripe (8) and the oxide (11a) on it by a lift-off technique.

9 Claims, 2 Drawing Sheets

LASER MANUFACTURE

This invention relates to laser manufacture and in particular to the manufacture of a ridge waveguide laser structure.

BACKGROUND OF THE INVENTION

Various methods of manufacturing ridge waveguide structures have previously been proposed. For example, the Kaminow method which uses standard processing with two-step photolithography, a first step to define double channels in, for example, a standard double heterojunction layer structure between which the ridge is disposed and a second step to open contact windows to the ridge. The ridge is electrically isolated from the remainder of the layer structure by silicon dioxide which is deposited to cover the entire device, and extends into the channels, following ridge definition and in which the contact windows to the ridges have to be subsequently opened. An alternative method involves only a single photolithographic step and a lift-off technique. In this method a standard double heterojunction layer structure is provided with a silicon dioxide layer on the cap layer and successive layers of titanium and gold deposited thereon. Using the single photolithographic step a window is provided in a photoresist layer the gold is etched via this window so that the photoresist is undercut. The titanium and silicon dioxide are then etched, the extent of the gold etching meaning that these layers are also etched a greater extent than exposed by the window. Successive layers of titanium and gold are then deposited over the photoresist during which process ridge contact layers of titanium and gold are built up in the undercut recess via the window and of dimensions determined by the window. The photoresist is then removed, simultaneously lifting off the titanium and gold layers deposited thereon, and the double channels etched using the structure produced so far to provide its own masking (self-aligned) to produce the full ridge structure which is already contacted. This method of manufacture results in the disadvantage that the sides of the doubles channels are not insulated and there is the possibility of short circuits when the devices have connections soldered thereto.

SUMMARY OF THE INVENTION

It is an object of the present invention to provide an alternative method of manufacturing ridge waveguide laser structures which is fully protected as well as self-aligned.

According to one aspect of the present invention there is provided a method of manufacturing a ridge waveguide laser structure including the steps of employing a photoresist stripe on a surface of a multilayer wafer to define the ridge, providing an insulating layer on said surface and on said photoresist stripe on the ridge, and removing the photoresist stripe whilst simultaneously lifting off the insulating layer thereon.

According to a further aspect of the present invention there is provided a ridge waveguide laser structure formed in a multilayer laser wafer and including an insulating layer extending over the processed surface of the wafer but only partway up the sidewalls of the ridge towards the outermost layer of the ridge and not on said outermost layer, and including an electrical contact to said outermost layer.

BRIEF DESCRIPTION OF THE DRAWINGS

Embodiments of the invention will now be described with reference to the accompanying drawings, in which.

DESCRIPTION OF THE PREFERRED EMBODIMENT

Figure 1:
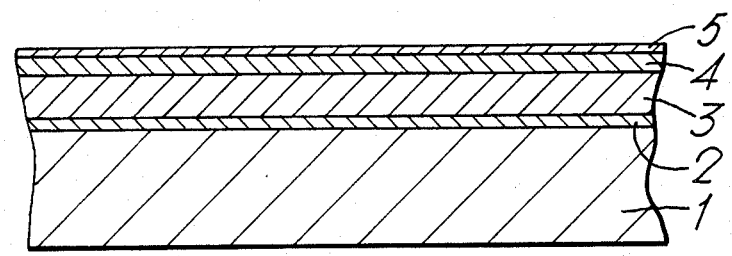
FIGS. 1 to 7 illustrate cross-sections through a device during successive processing stages.

The embodiment of ridge waveguide structure whose manufacture is to be described employs a laser wafer with a layer structure (FIG. 1) comprising an n passive/substrate layer 1, although a conventional double heterojunction structure with a separate n passive layer on an n substrate may alternatively been employed, a p active layer 2, a p passive layer 3, and a p cap layer 4. Typically the layer 1 is of InP, the layer 2 of GaInAsP, the layer 3 is of InP and the layer 4 is of GaInAsP or GaInAs. A silicon dioxide layer 5 is deposited on the cap layer 4.

In addition the active layer 2, may be split into 2 or 3 to include guide layers on either or both sides. The upper guide layer may also function as an "antimeltback" layer as well as a guide layer.

Figure 2:
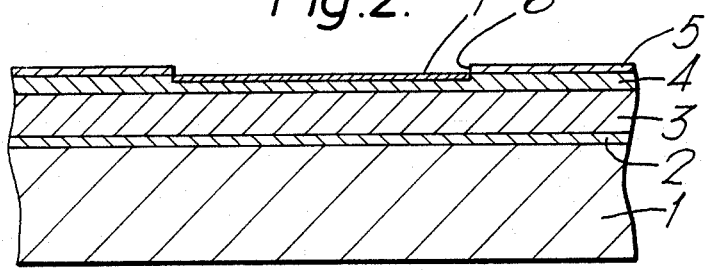

Using standard photolithography with photoresist (not shown) windows 6, (FIG. 2), which are typically 20 $\mu$m±5 $\mu$m wide and the full length of the wafer are etched in the silicon dioxide 5. At this stage an optional contact diffusion 7 may be performed if required using, for example, zinc or cadmium in a closed or open capsule.

Figure 3:
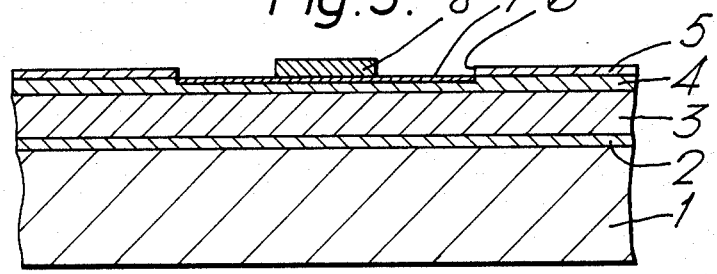

In a second photolithographic step a photoresist stripe 8 (FIG. 3) is defined on the cap layer 4 (which may be diffused 7 as shown) exposed by the window 6. The width of the stripe is determined by the required ridge waveguide width and for example may be 5 $\mu$m, the positioning within the window 6 is not critical.

Figure 4:
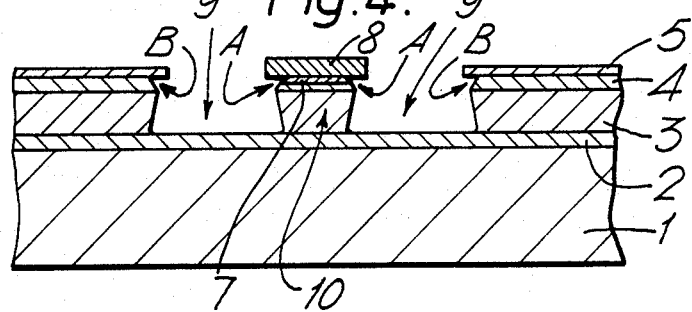

Using the longitudinal edges of the photoresist stripe 8 and the window 6 in the oxide 5 as a mask, double channels 9 (FIG. 4) to define the ridge 10 are etched first in the cap layer 4 using a suitable etchant, and then in the p passive InP layer 3 using an InP selective etch whereby etching of the channels stops automatically at the active layer 2, or an antimeltback layer (not shown) optionally provided thereon. Undercutting of the layers under the photoresist stripe 8 and the silicon dioxide 5 results as shown at A and B respectively.

Figure 5:
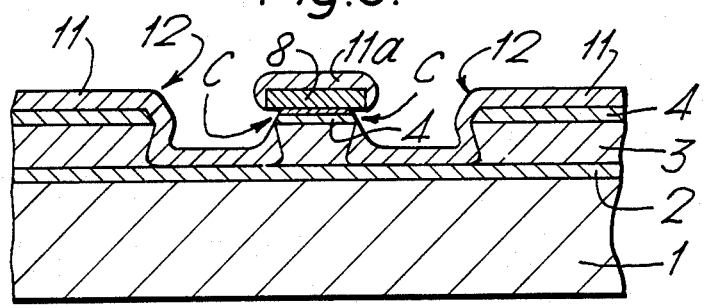

The remaining silicon dioxide is then stripped off and a passivating and insulating oxide 11, 11a (FIG. 5), for example aluminium oxide $Al_2O_3$ or $SiO_2$ or $Si_3N_4$, evaporated over the upper surface of the layer wafer as so far processed. As is apparent from FIG. 5 the oxide 11 is continuous over the channel edges 12 and extends part way up the ridge walls, but owing to the undercutting of the resist stripe 8, the oxide 11 is broken under the edges of the stripe 8, as shown at C.

Figure 6:
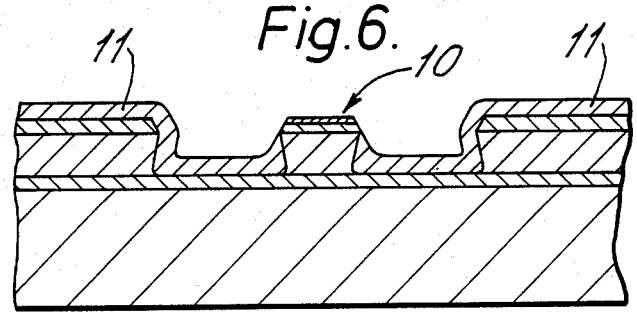
Figure 7:
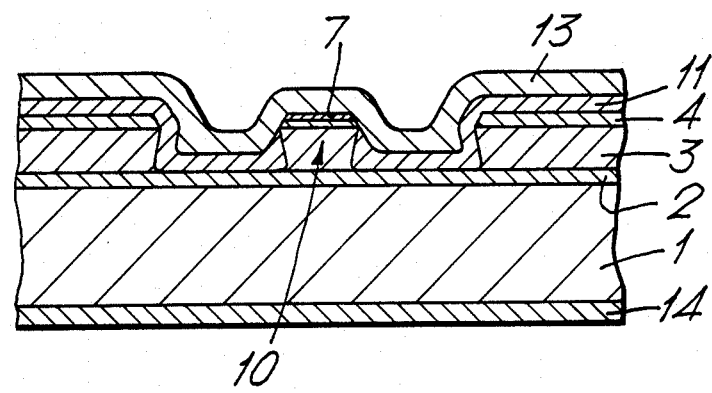

The photoresist stripe 8 is then stripped off using an appropriate solvent and simultaneously lifting off the portion of the oxide 11a on the ridge 10. The structure is then as illustrated in FIG. 6. It only remains to metallise both sides of the laser wafer for electrical contact purposes. The metallisation 13 to the p side of the laser wafer may be provided by the application of successive layers of titanium, platinum and gold (in that order) to the passivating layer 11 and the exposed cap layer 4. The metallisation 14 to the n side of the laser wafer may be provided an alloyed gold/tin layer to the substrate 1 followed by a gold layer.

The method described above thus employs two step photolithography (to define the window 6 and to define the resist stripe 8) and an evaporated insulator 11 together with a lift-off technique to give a fully protected and self-aligned laser structure, with a good life potential and low threshold voltage, and which is simpler than the conventional methods to implement.

I claim:

1. A method of manufacturing a ridge waveguide laser structure employing a multilayer wafer of the type having a n type substrate layer, having deposited thereon a p type active layer, having deposited thereon a p type passive layer, having deposited thereon a p type cap layer comprising the steps of:

depositing a layer of silicon dioxide on said p type cap layer;

forming a window in said silicon dioxide layer to contact said cap layer;

diffusing a contact layer in said window;

depositing a photoresist stripe on said contact layer, said stripe deposited relatively central with respect to said window to provide a channel area on either side of said stripe;

etching a channel on either side of said stripe, with said etched channel penetrating said cap layer and said p passive layer and stopping at said p active layer, said etching causing an undercut on either side of said stripe from said cap layer to said contact layer;

stripping off all of said remaining silicon dioxide layer;

evaporating a passivating and insulating oxide layer over the upper surface of said wafer as processed above to cover said channels on either side except at said undercut areas of said stripe;

stripping off said stripe and said insulating oxide layer covering said stripe; and metallizing said processed wafer for forming electrical contacts.

2. The method according to claim 1 wherein the step of forming said window includes photolithographically defining said window area on said silicon dioxide layer and etching said defined area to form said window.

3. The method according to claim 1 wherein the step of diffusing said contact layer includes diffusing a contact material selected from zinc or cadmium.

4. The method according to claim 2 wherein said window is about 10 $\mu$m wide with said stripe being about 5 $\mu$m wide.

5. The method according to claim 1 wherein said step of evaporating a passivating and insulating oxide layer includes evaporating an oxide material selected from $AL_2O_3$, $SiO_2$ or $Si_3N_4$.

6. The method according to claim 1 wherein the step of metallizing includes metallizing the surface of said processed wafer containing said oxide layer with successive layers of titanium, platinum and gold.

7. The method according to claim 6 wherein said step of metallizing further includes metallizing the bottom surface of said n type substrate layer with an alloyed gold/tin layer followed by a gold layer.

8. The method according to claim 1 wherein the step of depositing a photoresist stripe includes photolithographically defining said stripe on said cap layer.

9. The method according to claim 1 wherein said n type substrate layer is n type InP, with said p type active layer being GaInAsP, with said p type passive layer being InP, and with said top layer being GaInAsP.

* * * * *